US005477175A

United States Patent [19]

Tisinger et al.

[11] Patent Number: 5,477,175

[45] Date of Patent: Dec. 19, 1995

[54] OFF-LINE BOOTSTRAP STARTUP CIRCUIT

[75] Inventors: Eric W. Tisinger; David M. Okada, both of Chandler, Ariz.

[73] Assignee: Motorola, Schaumburg, Ill.

[21] Appl. No.: 140,944

[22] Filed: Oct. 25, 1993

[51] Int. Cl.$^{6}$ .......... H03L 7/00

[52] U.S. Cl. .......... 327/143; 327/110; 315/411; 348/730; 363/20; 363/21; 363/49; 363/97

[58] Field of Search .......... 307/272.3, 296.4, 307/318, 544, 578; 315/411; 348/537, 730; 363/20, 21, 49, 97; 327/142, 143, 110, 310, 390, 545, 584

[56] References Cited

U.S. PATENT DOCUMENTS

| | | | |
|---|---|---|---|
| 4,799,138 | 1/1989 | Chahabadi et al. | 363/21 |
| 5,014,178 | 5/1991 | Balakrishnan | 363/49 |
| 5,051,611 | 9/1991 | Kantz | 307/272.3 |
| 5,111,070 | 5/1992 | Murphy et al. | 307/311 |
| 5,189,600 | 2/1993 | Keck et al. | 363/212 |
| 5,285,369 | 2/1994 | Balakrishnan | 363/49 |
| 5,291,387 | 3/1994 | Ohshima | 363/56 |
| 5,313,381 | 5/1994 | Balakrishnan | 363/147 |

*Primary Examiner*—Timothy P. Callahan
*Assistant Examiner*—Jeffrey Zweizig
*Attorney, Agent, or Firm*—Edward J. Mischen

[57] ABSTRACT

A novel off-line bootstrap startup circuit (10) including a high voltage device (100) for providing an initial bias voltage to an integrated circuit (IC) is provided. The high voltage device includes an NMOS transistor (102) having a high source to ground breakdown voltage thereby extending a bias voltage range provided to the IC. This bias voltage range may be needed to support large comparator (303) hysteresis and allow for an unregulated bias voltage. The bootstrap startup circuit becomes inoperative when the bias voltage exceeds a predetermined value.

18 Claims, 2 Drawing Sheets

300

OFF-LINE BOOTSTRAP STARTUP CIRCUIT

BACKGROUND OF THE INVENTION

This invention relates to startup circuits and, more particularly, to bootstrap startup circuits that are used in power supplies to initialize the bias voltage to integrated circuits.

Generally, a bootstrap startup circuit provides an initial voltage across a capacitor prior to a power supply for the integrated circuit attaining its predetermined value. Further, the bootstrap startup circuit is turned off once the power supply attains its predetermined value.

Typically, a bootstrap startup circuit may include a single resistor or a power up transistor circuit. However, a disadvantage of the single resistor bootstrap startup circuit is that it draws a significant amount of current, while a disadvantage of the integrated power up transistor bootstrap startup circuit is that the bias voltage range is limited to a maximum of approximately 10–15 volts. This limited bias voltage range may become a problem when a wider bias voltage range is needed such as when primary-side control integrated circuits have an input voltage range of 10–30 volts.

Hence, there is a need for a bootstrap startup circuit that has a lower current drain and for providing a wide bias voltage range.

DETAILED DESCRIPTION OF THE DRAWINGS

Generally, the present invention provides a circuit coupled to a line voltage for providing a wider bias voltage range to an integrated circuit. This is accomplished by using a technique known as bootstrapping. A high voltage startup device provides bias current to initialize the supply voltage to a control circuit. However, once the power supply of the integrated circuit reaches its predetermined value, the startup device is switched off to minimize power dissipation. Thus, the present invention describes a novel high voltage startup device that simplifies circuit design, increases the supply voltage range of-the control circuit, and eliminates the need for a dedicated high voltage pin, if a power switching transistor is integrated in the same package.

Figure 1:
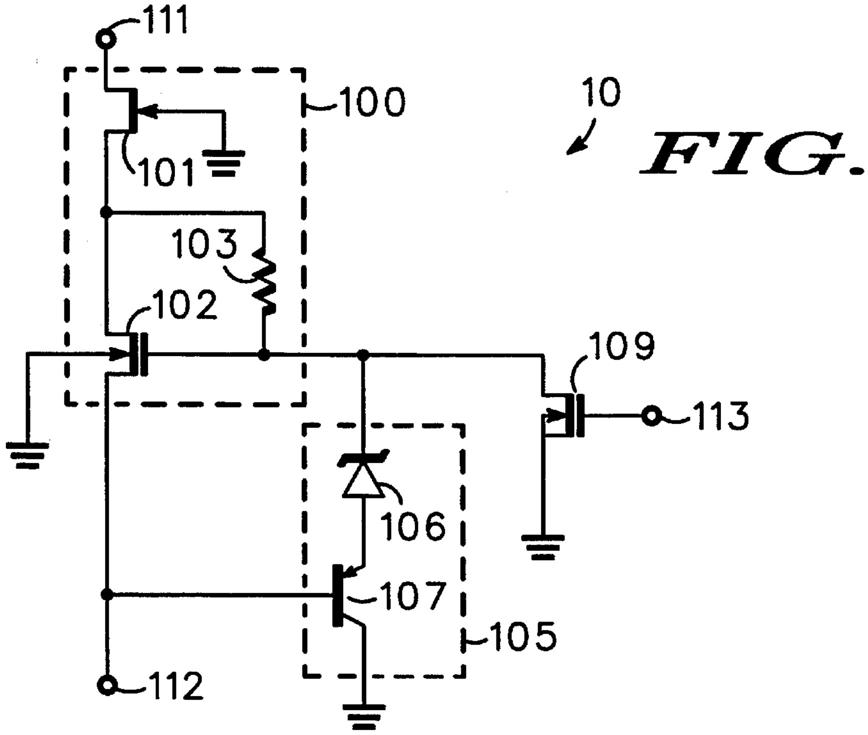
FIG. 1 is a detailed schematic diagram illustrating an off-line bootstrap startup circuit in accordance with the present invention.

The present invention can be more fully described with reference to FIGS. 1–4. FIG. 1 is a detailed schematic diagram illustrating an off-line bootstrap circuit 10 that includes a high voltage device 100, clamping circuit 105, and control transistor 109 for turning off device 100.

In a preferred embodiment, the high voltage device 100 includes JFET transistor 101, NMOS transistor 102, and n-well resistor 103. The JFET transistor 101 is an n-channel, depletion mode JFET transistor with a source to backgate pinch-off voltage of approximately 50 V. The backgate is connected to ground, the drain is connected to terminal 111 at which a line voltage is applied thereat, and the source is connected to the drain of NMOS transistor 102 and the first terminal of n-well resistor 103.

When device 100 is ON, the current through JFET transistor 101 is controlled by the NMOS transistor 102, and must be limited by the duty cycle of a control signal so as not to exceed the safe operating area of the JFET transistor 101. When device 100 is OFF, the current through JFET transistor 101 is controlled by the bias current through n-well resistor 103. This bias current must be small to minimize the power dissipated by device 100.

When a line voltage is applied to the drain of the JFET transistor 101, the JFET transistor's body is fully depleted with a typical source to substrate pinch-off voltage of 50 V wherein the body of the JFET transistor is often referred to as the drift region of the high voltage device 100. The JFET transistor 101 is operated in its current saturation region. Since the source voltage of JFET 101 is limited to approximately 50 V, most of the line voltage applied at terminal 111 is dropped across the body of the JFET transistor thereby providing a buffer from the line voltage. This protects the NMOS transistor 102 and n-well resistor 103 that are connected to this node.

The NMOS transistor 102 is an n-channel enhancement mode MOS transistor with a threshold range of 1.5 V. The drain of transistor 102 is connected to the source of JFET transistor 101 and a first terminal of n-well resistor 103. The source of transistor 102 is connected to terminal 112. The gate of transistor 102 is connected to a second terminal of n-well resistor 103, clamping circuit 105, and turn-off device 109. The backgate of transistor 102 is connected to ground.

The drain voltage of transistor 102 is limited by JFET transistor 101. The source voltage of transistor 102 should be limited to approximately 50V by external circuitry (not shown) coupled to terminal 112. The gate voltage of transistor 102 is limited by the clamping circuit 105. Startup applications do not require tight control of the current through transistor 102. The startup current should generally be in the range of 5 mA to 25 mA as the voltage at the source of transistor 102 ramps from 0 V to 20 V. This can be accomplished without closed loop control. The gate voltage of transistor 102 should be as large as possible to minimize current variation due to backgate effects. The current amplitude is set by adjusting the channel length of NMOS transistor 102. The device design of NMOS transistor 102 will be discussed later with reference to FIGS. 2 and 3.

The n-well resistor 103 provides bias current to turn on NMOS transistor 102. To minimize the resistor's value and its physical layout, the first terminal of the n-well resistor is connected to the drain of NMOS transistor 102, and the second terminal of the n-well resistor is connected to the gate of the NMOS transistor 102. The bias current is kept small since it is conducted from the line voltage through JFET transistor 101 after the high voltage device 100 is turned OFF. The narrow n-well resistor 103 has significant depletion effects which makes its electrical behavior more characteristic of a JFET than an ideal resistor. It is designed to supply approximately 25 uA of bias current when the gate of the NMOS transistor 102 is at ground. The n-well resistor 103 is designed so that its pinch-off voltage is sufficiently high so as not to interfere with the function of the clamping circuit 105.

Clamping circuit 105 limits the voltage appearing at the control electrode of transistor 102 thereby limiting the current flowing between terminals 111 and 112. Clamping circuit 105 includes an avalanche diode 106 having a typical breakdown voltage of 10 V, and a PNP transistor 107. The cathode of the diode is connected to the gate of the NMOS transistor 102. The anode of the diode is connected to the emitter of the PNP transistor 107. The base of the PNP transistor is connected to the source of the NMOS transistor 102, and the collector of the PNP transistor is connected to ground reference.

The clamping voltage is typically below 20 V to prevent long term degradation of the gate oxide of the NMOS transistor 102. Clamping circuit 105 has a forward voltage of 11 V. The 10 V avalanche diode was selected for its low leakage, providing a sharp knee at low bias currents. To simplify the design of the ON/OFF control function, it is desirable to allow the gate of the NMOS transistor 102 to be pulled to ground, yet allow the source of the NMOS transistor 102 to exceed 50 V. Thus, clamping circuit 105 has a reverse blocking voltage in excess of 50 V due to the high $BV_{EBO}$ voltage of the PNP transistor 107.

The high voltage device 100 is turned OFF by pulling its control terminal to ground. This ON/OFF function can be implemented using a single pull-down control transistor 109. The source and backgate of transistor 109 is connected to ground. The drain of transistor 109 is connected to the control terminal of high voltage device 100. The gate of transistor 109 is coupled to terminal 113 at which a control signal is applied thereat.

When the control signal applied at terminal 113 is a logic low, control transistor 109 is OFF, and high voltage device 100 is ON and provides a high source to ground breakdown voltage between terminals 111 and 112 and also a high current between terminals 111 and 112. However, when the control signal applied at terminal 113 is a logic high, control transistor 109 pulls the control terminal of high voltage device 100 to ground thereby turning device 100 OFF thereby providing a high impedance between terminals 111 and 112. The breakdown voltage at the drain of control transistor 109 should exceed 30 V so as not to interfere with the function of clamping circuit 105. Transistor 109 may take the form of a high voltage DMOS type transistor.

In summary, the present invention provides an off-line start up circuit that includes a high voltage device. The high voltage device provides an initial current for increasing a voltage at a bias terminal. However, once the voltage appearing at the bias terminal reaches a predetermined threshold, the high voltage device is rendered non-operative. The high voltage device includes an NMOS transistor having a high source to ground breakdown voltage for extending a usable voltage range appearing at the bias terminal.

Figure 2:
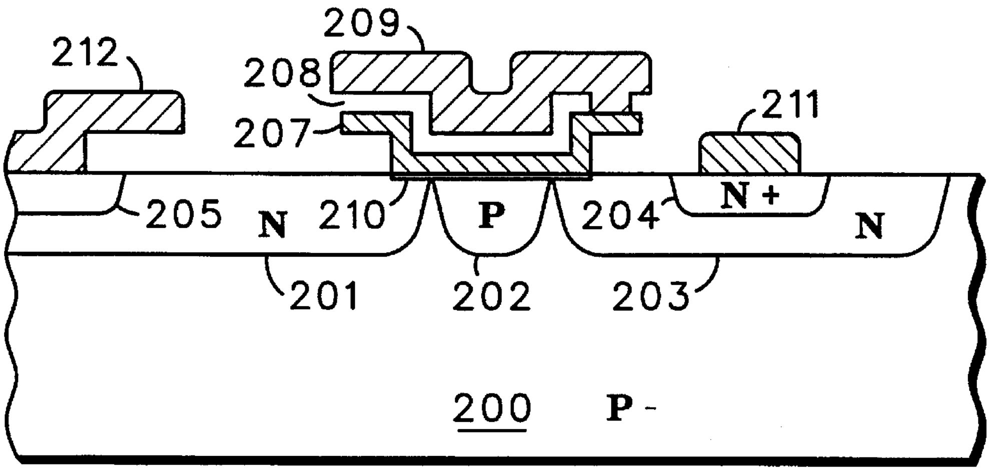
FIGS. 2 and 3 are detailed pictorial diagrams illustrating cross-section views of a high voltage device shown in FIG. 1.
Figure 3:
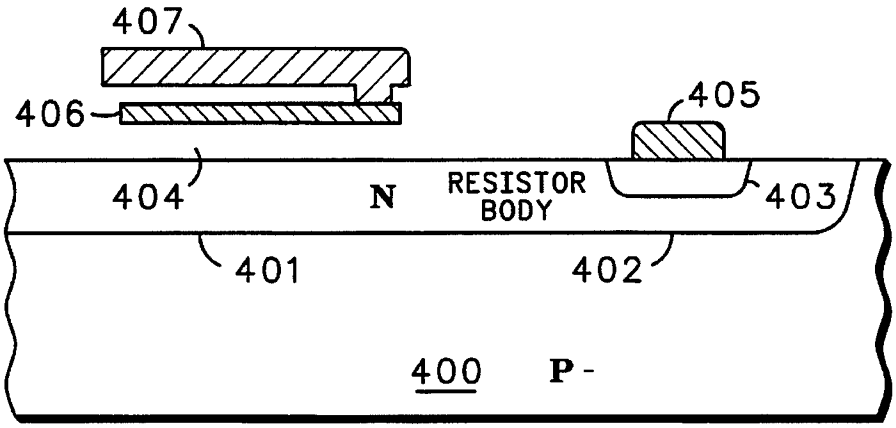

The high voltage device 100 can be illustrated with two regions with each region differing in device operation. These two regions are merged into a complex but unified device structure. FIGS. 2 and 3 are pictorial diagrams illustrating cross-section views showing these two regions of high voltage device 100. FIG. 2 shows a cross-section slicing through the transistors 101 and 102. FIG. 3 shows a cross-section slicing through the JFET transistor 101 and n-well resistor 103. For clarity, the drawings are not shown to scale.

The central drain contact region (212) includes the drain bonding pad. This closed geometry is a common way of using a bond wire to avoid running high voltage metal across the surface of the die. FIG. 2 is a cross-section of high voltage device 100 in a region where the JFET transistor (101) is coupled to the NMOS transistor (102). The n-well region 201 is the body of the JFET transistor 101. The drain region of device 100 is on the left end of the body, and the source region of device 100 is on the right end. The substrate 200 serves as the backgate junction. The source of the JFET transistor 101 and the drain of the NMOS transistor 102 are merged so that no contact region is required, and there is no distinct boundary between the two transistors. The NMOS transistor 102 has a source region 203 with contact 204 and a metal electrode 211, a backgate p-well diffusion 202, and a silicon gate electrode 207 that is used to form channel 210 during conduction.

The breakdown voltage at the drain of transistor 101 must exceed 400 V for world-wide line voltage applications. The lengths of the drain metal field plate 212, the gate metal field plate 209, and n-well region 201 which forms the body of the JFET transistor are optimized for this particular breakdown voltage. The breakdown voltage at the source of transistor 102 must exceed 50 V to support a wide bias supply voltage range. This is accomplished by using n-well as the source diffusion to provide high breakdown voltage relative to the substrate, and by spacing the source contact region 204 away from the channel to reduce the voltage drop across the gate oxide. The maximum sustained voltage across the thin gate oxide must be kept below 20 V for long term reliability considerations.

A worst case reverse bias occurs when both current carrying terminals (the drain of transistor 101 and source of transistor 102) of device 100 are at maximum voltage, and the control terminal of device 100 is grounded. The JFET drain edge of the n-well region 201 and the p-well backgate region 202 are spaced so that the depletion spread under reverse bias conditions greatly reduces the voltage across the gate oxide. The p-well region 202 sets the threshold voltage and also prevents punch through between drain and source regions 201 and 203. The backgate is inherently connected to ground through the substrate, which eliminates the parasitic drain-source diode and allows the drain voltage of device 100 to swing to ground. The n-well resistor (103) must be able to bias the gate electrode 207 up to 30 V without pinching off. This is accomplished by keeping the p-well diffusion away from the body of the n-well resistor to minimize the depletion effects.

FIG. 3 is a cross-section of device (100) in the region where the source end of JFET transistor (101) is coupled to the "high" end of the N-well resistor (103). The N-well region 401 is the body of the JFET transistor 101 and corresponds to region 201 of FIG. 2. The drain contact is located on the left end of the body and the source end is the N-well region adjacent to the left edge of the gate electrode (406/207). The p- substrate 400 which corresponds to p-substrate 200 of FIG. 2 functions as the back gate of the JFET transistor. The source of the JFET transistor and the "high" side of the N-well resistor are merged and there is no distinct boundary between the two devices. The resistance of the N-well resistor is controlled by adjusting the distance between region 402 and the N-well resistor contact enhancement diffusion (403). Electrical contact to the "low" end of the N-well resistor 403 is provided by the N-well resistor contact (405). Region 404 consists of an insulating dielectric film electrically separating regions 401 and 406.

The potential of the N-well in region 401 may be biased to up to a maximum of approximately 50 V, while the electrode 406 may be at ground Region 404 is thick field oxide, so the resultant electric field applied across this oxide is very small resulting in a negligible effect on the long term reliability of the device.

The silicon gate electrode (207/406) is utilized to form the conducting channel 210 of the NMOS transistor, but has no significant effect in this region of resistor 103 of device 100. The length of the gate metal field plate 407 is similar to plate 209 as aforedescribed.

Prior art startup devices do not allow for large hysteresis in the UVLO Comparator thresholds, making the startup sequence more difficult. The startup technique described in U.S. Pat. No. 5,014,178, assigned to Power Integrations, Inc. and having an issue date of May 7, 1991, teaches a method of interleaving the switching of the startup device and the switching device so that the startup device provides bias current to the control circuit during the OFF-time of the switching device. However, this requires the startup device to be switched at high frequency, typically in excess of 50 kHz. This is generally not obtainable with the small currents involved in biasing the startup device.

Figure 4:
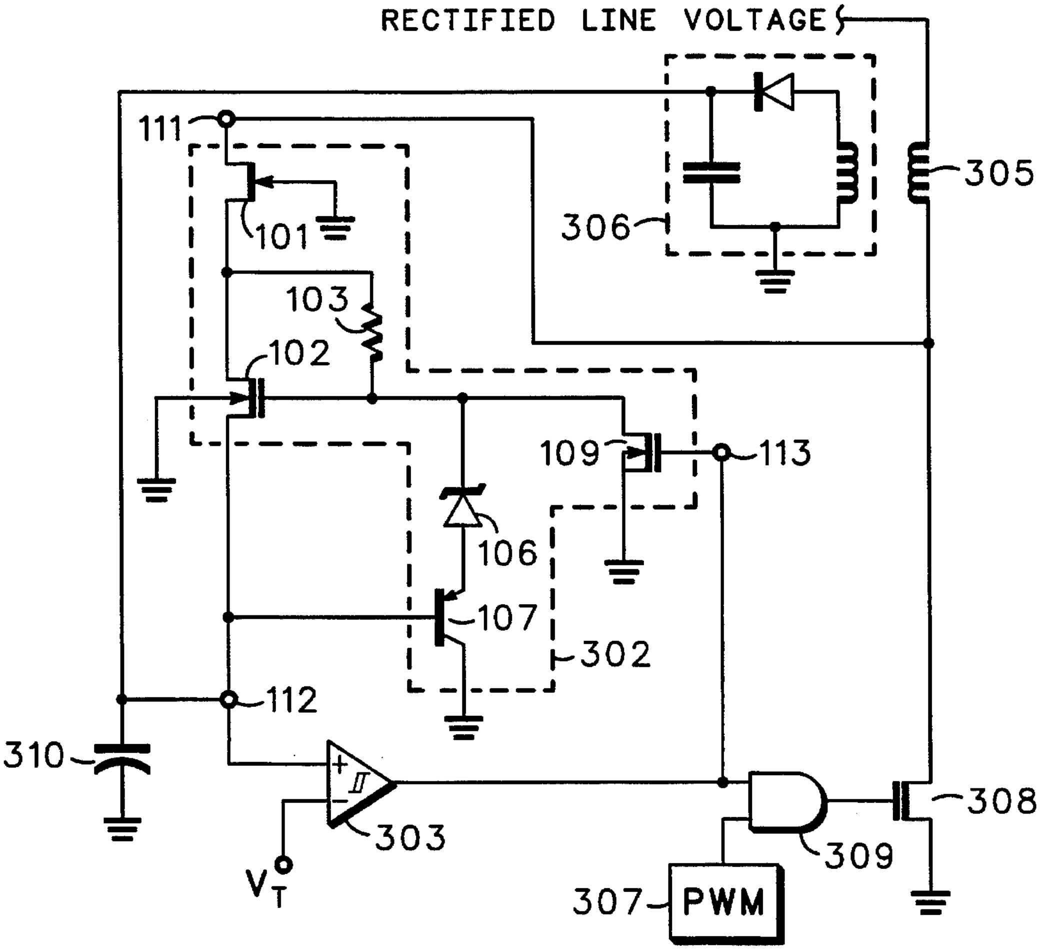
FIG. 4 is a schematic/block diagram illustrating a circuit including the off-line bootstrap startup circuit of FIG. 1 for switching an inductive load.

However, referring to FIG. 4, which illustrates circuit 300 including the bootstrap circuit shown in FIG. 1 for switching inductive load 305, circuit 300 does not require high frequency switching of the bootstrap circuit 302. During normal operation, the bootstrap circuit 302 is turned ON only once and after a rectified line voltage is applied. The slow, controlled nature of the UVLO Comparator guarantees that there is no interference between the two high voltage devices that share the common high voltage pin. There is generally a deadtime between when the bootstrap circuit is turned OFF, and when the switching device is turned ON. This deadtime provides time for the analog portion of the control circuit to switch from a sleep mode to an awake mode.

Circuit 300 includes off-line bootstrap circuit 302, switching circuit 307 and 308, and under voltage lock out (UVLO) circuit 303. The off-line bootstrap circuit 302, which corresponds to bootstrap circuit 10 of FIG. 1, is coupled to a rectified line voltage through inductive load 305. Since the bootstrap circuit 302 conducts only a small continuous current, the voltage drop across inductive load 305 should be substantially equal to zero. High voltage terminal 111 of bootstrap circuit 302 is coupled to the high voltage drain electrode of switching transistor 308 to from a common connection thereat. This common connection couples the high voltage nodes of bootstrap circuit 302 and switching device 308 thereby allowing for one IC pin when both high voltage devices reside in the same package. In addition, it improves the ESD ruggedness of the physically small bootstrap circuit device.

Since the high voltage terminals of bootstrap circuit 302 and switching device 308 are coupled to the same node, they must not be allowed to conduct at the same time or else the bias terminal 112 will be discharged. Therefore, passgate 309 guarantees that while the bootstrap circuit 302 is ON, the switching device 308 is OFF.

The UVLO Comparator 303 has a first input coupled to terminal 112 and a second input coupled to receive a threshold voltage $V_T$. The output of comparator 303 is coupled to terminal 113 and to a first input of passgate gate 309. Comparator 303 has a large threshold hysteresis, with an upper threshold of typically 15 V, and a lower threshold of typically 10 V. The large hysteresis makes the bootstrap startup function easier to implement.

The UVLO Comparator 303 controls the sequencing of events during the bootstrap startup period. When a rectified line voltage is first applied to terminal 111 via inductive load 305, terminal 112 is at ground, below the upper threshold of UVLO Comparator 303, causing its output to be low. The output is coupled so that a low signal turns ON bootstrap circuit 302, and disables passgate 309, holding OFF switching device 308. The startup current supplied by bootstrap circuit 302 then ramps the voltage at terminal 112 to the upper threshold of UVLO Comparator 303, causing its output to go high. The output is coupled so that a high signal turns OFF bootstrap circuit 302, and enables passgate 309 so that the PWM circuit 307 controls the conduction of switching device 308. It normally takes several switching cycles before the power supply 306 can deliver bias current to the PWM control circuit 307. There may be additional delay due to the soft start function within the PWM circuit. During this conduction dead band, the bias current to the PWM circuit 307 is supplied by the bypass capacitor 310. Capacitor 310 must be large enough so that the voltage at terminal 112 does not drop below the lower threshold of the UVLO comparator 303. If this happens, the startup sequence is reinitiated.

The present invention provides an off-line startup circuit for providing a wider bias voltage range to an integrated circuit. The startup circuit described is implemented on a high voltage integrated circuit (HVIC) technology that is optimized for low side switch applications.

Previous startup circuits included a high voltage device that typically uses the same transistor design as the low side power switching device. This is normally implemented as an enhancement mode lateral DMOS transistor connected in series with a depletion mode lateral JFET transistor where the JFET transistor serves as the drift region of the high voltage device. However, because the technology is designed for grounded source switching applications, the floating high voltage startup transistor is difficult to implement.

In a DMOS type transistor, the source to substrate breakdown voltage is limited to 10 V to 15 V. For maximum breakdown voltage, the backgate of the DMOS transistor is connected to its source and isolated from the substrate by extending the drain n-type well region underneath the p-type body region. The n-type well has a junction depth of approximately 5 um, while the p-type body has a junction depth of approximately 2 um. However, because the n-type isolating layer is so thin and lightly doped, the typical breakdown voltage between the p-type body and the substrate is only 15 V. In addition, the isolated DMOS transistor is substantially different from the grounded source transistor, requiring a different design for the drift length and field plates.

An alternate technique that uses the grounded backgate design of the standard switching transistor which allows the drain to swing below the source without forward biasing the parasitic drain-body diode. This further reduces the source to substrate breakdown voltage to typically 10 V.

However, a goal of the startup circuit of the present invention is to provide a high source voltage so as not to limit the supply voltage range of the integrated circuit it connects to wherein a small supply voltage range results in a need for tight regulation. The NMOS transistor described in FIGS. 2 and 3 provides much higher breakdown voltage than can be achieved with DMOS type transistors. The NMOS transistor can be controlled with the simple circuit described in FIG. 1.

While the invention has been described in specific embodiments thereof, it is evident that many alterations, modifications and variations will be apparent to those skilled in the art. Further, it is intended to embrace all such alterations, modifications and variations in the appended claims.

We claim:

1. An off-line bootstrap circuit being responsive to a line voltage for providing a bias voltage to an integrated circuit, the off-line bootstrap circuit comprising:

a high voltage device having first and second current carrying terminals and a control terminal, said first current carrying terminal of said high voltage device being connected for receiving the line voltage, said second current carrying terminal of said high voltage device being coupled for providing the bias voltage, said high voltage device including, (a) a first transistor for extending a range of the bias voltage, said first transistor having first and second current carrying electrodes and a control electrode, said second current carrying electrode coupled for providing the bias voltage, said control electrode of said first transistor coupled to said control terminal of said high voltage device, and (b) a second transistor having first and second current carrying electrodes and a control electrode, said first current carrying electrode connected for receiving the line voltage, said second current carrying electrode connected to said first current carrying electrode of said first transistor, said control electrode of said second transistor coupled to a first supply voltage terminal wherein said first current carrying electrode of said first transistor is merged in a common region with said second current carrying electrode of said second transistor:

control means having an output coupled to said control terminal of said high voltage device and responsive to a control signal for rendering said high voltage device inoperative when the bias voltage has exceeded a predetermined threshold; and a switching transistor having a first electrode coupled to said output of said control means for receiving a switching signal, a second electrode coupled to said first supply voltage terminal, and a third electrode connected to the line voltage.

2. The off-line bootstrap circuit according to claim 1 wherein said first transistor is an N-channel enhancement mode transistor.

3. The off-line bootstrap circuit according to claim 1 wherein said first transistor includes N-well source and drain regions.

4. The off-line bootstrap circuit according to claim 1 wherein said high voltage device further includes a resistor having first and second terminals respectively coupled to said second current carrying electrode of said second transistor and said control electrode of said first transistor, wherein said second current carrying electrode of said second transistor is merged in a common region with said first terminal of said resistor.

5. The off-line bootstrap circuit according to claim 4 wherein said resistor is separated from said control terminal of said first transistor by a dielectric.

6. The off-line bootstrap circuit according to claim 1, further comprising clamping means coupled to said control terminal of said high voltage device for limiting voltage appearing thereat.

7. The off-line bootstrap circuit according to claim 1, further comprising a logic circuit having a first input coupled to said output of said control means, and having an output coupled to said first electrode of said switching transistor.

8. The off-line bootstrap circuit according to claim 1, further comprising a pulse width modulator circuit having an output for providing a pulse width modulated signal, said output of said pulse width modulator circuit coupled to a second input of said logic circuit.

9. The off-line bootstrap circuit according to claim 7 wherein said logic circuit is a NAND gate.

10. The off-line bootstrap circuit according to claim 6 wherein said clamping means includes:

a transistor having first and second current carrying electrodes and a control electrode, said first current carrying electrode of said transistor coupled to a first supply voltage terminal, said control electrode of said transistor coupled to said second terminal of said high voltage device; and a diode coupled between said control terminal of said high voltage device and said second current carrying electrode of said transistor.

11. The off-line bootstrap circuit according to claim 1 wherein said control means includes a transistor having first and second current carrying electrodes and a control electrode, said first current carrying electrode of said transistor coupled to said control terminal of said high voltage device, said second current carrying electrode of said transistor coupled to a first supply voltage terminal, said control electrode of said transistor coupled for receiving said control signal.

12. An integrated circuit for switching an inductive load, the inductive load coupled between a line voltage and a first pin of the integrated circuit, the integrated circuit comprising:

a bootstrap circuit connected to the first pin of the integrated circuit for providing an initial bias voltage at a first terminal, wherein said bootstrap circuit includes a high voltage device having first and second current carrying terminals and a control terminal, said first current carrying terminal of said high voltage device being connected to the first pin of the integrated circuit, said second current carrying terminal of said high voltage device being coupled to said first terminal, said high voltage device including, (a) a first transistor for extending a range of said bias voltage, said first transistor having first and second current carrying electrodes and a control electrode, said second current carrying electrode coupled for providing said bias voltage, said control electrode coupled to a control means, (b) a second transistor having first and second current carrying electrodes and a control electrode, said first current carrying electrode connected for receiving the line voltage, said second current carrying electrode connected to said first current carrying electrode of said first transistor, said control electrode of said second transistor coupled to a first supply voltage terminal wherein said first current carrying electrode of said first transistor is merged in a common region with said second current carrying electrode of said second transistor;

switching means connected to the first pin of the integrated circuit for alternately switching the inductive load on and off; and first circuit means coupled to said first terminal for turning off said bootstrap circuit and for enabling said switching means when said initial bias voltage appearing at said first terminal exceeds a predetermined threshold, wherein when said bootstrap circuit is turned off a voltage appearing at said first terminal is provided via the inductive load.

13. The integrated circuit according to claim 12 wherein said bootstrap circuit includes:

clamping means coupled to said control terminal of said high voltage device for limiting voltage appearing thereat; and control means coupled to said control terminal of said high voltage device and responsive to said first circuit means for rendering said high voltage device inoperative when said voltage appearing at said first terminal has exceeded a predetermined threshold.

14. The integrated circuit according to claim 12 wherein said switching means includes:

a pulse width modulator circuit for providing a pulse width modulated output signal; and a switching transistor having first and second current carrying electrodes and a control electrode, said first current carrying electrode of said switching transistor coupled to the first pin of the integrated circuit, said second current carrying electrode of said switching transistor coupled to a first supply voltage terminal, said control electrode of said switching transistor being coupled for receiving said pulse width modulated output signal.

15. The integrated circuit according to claim 12 further including second circuit means coupled to the inductive load for providing a voltage at said first terminal when said bootstrap means is rendered non-operative.

16. The integrated circuit according to claim 12 wherein said first circuit means includes a comparator having first and second inputs and an output, said first input of said comparator coupled to said first terminal, said second input of said comparator coupled for receiving a threshold voltage, said output of said comparator coupled to said switching means.

17. The integrated circuit according to claim 16 wherein said first circuit means further includes logic means coupled to said comparator and said switching means for alternately enabling said bootstrap means and said switching means.

18. An off-line bootstrap circuit being responsive to a line voltage for providing a bias voltage to an integrated circuit, the off-line bootstrap circuit comprising:

a high voltage device having first and second current carrying terminals and a control terminal, said first current carrying terminal of said high voltage device being connected for receiving the line voltage, said second current carrying terminal of said high voltage device being coupled for providing the bias voltage, said high voltage device including, (a) a first transistor for extending a range of the bias voltage, said first transistor having first and second current carrying electrodes and a control electrode, said second current carrying electrode coupled for providing the bias voltage, said control electrode of said first transistor coupled to said control terminal of said high voltage device, and (b) a second transistor having first and second current carrying electrodes and a control electrode, said first current carrying electrode connected for receiving the line voltage, said second current carrying electrode connected to said first current carrying electrode of said first transistor, said control electrode of said second transistor coupled to a first supply voltage terminal wherein said first current carrying electrode of said first transistor is merged in a common region with said second current carrying electrode of said second transistor;

clamping means coupled to said control terminal of said high voltage device for limiting voltage appearing thereat;

control means having an output coupled to said control terminal of said high voltage device and responsive to a control signal for rendering said high voltage device inoperative when the bias voltage has exceeded a predetermined threshold;

a logic circuit having an output, a first input coupled to said control terminal of said high voltage device, and a second input for receiving an output of a pulse width modulator; and a switching transistor having a first electrode coupled to said output of said logic circuit, a second electrode coupled to said first supply voltage terminal, and a third electrode connected to the line voltage.

* * * * *